United States Patent
Li et al.

(10) Patent No.: US 10,347,622 B2
(45) Date of Patent: Jul. 9, 2019

(54) SILICON-CONTROLLED RECTIFIERS HAVING A CATHODE COUPLED BY A CONTACT WITH A DIODE TRIGGER

(71) Applicant: GLOBALFOUNDRIES Inc., Grand Cayman (KY)

(72) Inventors: You Li, Essex Junction, VT (US); Manjunatha Prabu, Malta, NY (US); Mujahid Muhammad, Essex Junction, VT (US); John B. Campi, Jr., Westford, VT (US); Robert J. Gauthier, Jr., Hinesburg, VT (US); Souvick Mitra, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/398,946

(22) Filed: Jan. 5, 2017

(65) Prior Publication Data

US 2018/0190644 A1    Jul. 5, 2018

(51) Int. Cl.
| | |
|---|---|
| *H01L 27/02* | (2006.01) |
| *H01L 27/06* | (2006.01) |
| *H01L 29/06* | (2006.01) |
| *H01L 29/08* | (2006.01) |
| *H01L 29/74* | (2006.01) |

(52) U.S. Cl.
CPC ...... *H01L 27/0262* (2013.01); *H01L 29/0834* (2013.01); *H01L 29/0839* (2013.01); *H01L 29/7428* (2013.01); *H01L 29/7436* (2013.01); *H01L 27/0641* (2013.01); *H01L 29/0653* (2013.01)

(58) Field of Classification Search
None
See application file for complete search history.

(56) References Cited

U.S. PATENT DOCUMENTS

| | | |
|---|---|---|
| 6,768,616 B2 | 7/2004 | Mergens et al. |
| 7,135,745 B1 | 11/2006 | Horch et al. |
| 7,638,370 B2 | 12/2009 | Gossner et al. |

(Continued)

FOREIGN PATENT DOCUMENTS

WO    2014056909 A1    4/2014

OTHER PUBLICATIONS

Taiwan Intellectual Property Office, Examination Report issued in Taiwanese Patent Application No. 106139176 dated Oct. 18, 2018.

*Primary Examiner* — Su C Kim
*Assistant Examiner* — David S Wilbert
(74) *Attorney, Agent, or Firm* — Thompson Hine LLP; Anthony Canale (57) ABSTRACT

Silicon-controlled rectifiers, electrostatic discharge circuits, and methods of fabricating a silicon-controlled rectifier for use in an electrostatic discharge circuit. A device structure for the silicon controlled rectifier includes a first well of a first conductivity type in a semiconductor layer, a second well of a second conductivity type in the semiconductor layer, a cathode coupled with the first well, and an anode coupled with the second well. First and second body contacts are coupled with the first well, and the first and second body contacts each have the first conductivity type. A triggering device may be coupled with the first body contact.

15 Claims, 3 Drawing Sheets

(56) References Cited

U.S. PATENT DOCUMENTS

| | | |
|---|---|---|
| 7,923,266 B2 | 4/2011 | Thijs et al. |
| 8,785,968 B2 | 7/2014 | Shrivastava et al. |
| 8,963,201 B2 | 2/2015 | Shrivastava et al. |
| 2002/0154463 A1 | 10/2002 | Mergens et al. |
| 2007/0262386 A1 | 11/2007 | Gossner et al. |
| 2009/0309167 A1 | 12/2009 | Russ et al. |
| 2010/0062573 A1 | 3/2010 | Gossner et al. |
| 2010/0207161 A1 | 8/2010 | Shrivastava et al. |
| 2013/0229223 A1* | 9/2013 | Shrivastava .......... H01L 29/102 327/438 |
| 2013/0285111 A1* | 10/2013 | Di Sarro ................. H01L 21/84 257/107 |
| 2015/0144997 A1 | 5/2015 | Shrivastava et al. |

* cited by examiner

SILICON-CONTROLLED RECTIFIERS HAVING A CATHODE COUPLED BY A CONTACT WITH A DIODE TRIGGER

BACKGROUND

The invention generally relates to semiconductor manufacturing and integrated circuits and, more particularly, to silicon-controlled rectifiers, electrostatic discharge circuits, and methods of fabricating a silicon-controlled rectifier for use in an electrostatic discharge circuit.

An integrated circuit may be exposed to electrostatic discharge (ESD) events that can direct potentially large and damaging ESD currents to the integrated circuits of the chip. An ESD event involves an electrical discharge from a source, such as the human body or a metallic object, over a short duration and can deliver a large amount of current to the integrated circuit. An integrated circuit may be protected from ESD events by, for example, incorporating an ESD protection circuit into the chip. Upon the occurrence of an ESD event, the ESD protection circuit triggers a power clamp device to enter a low-impedance, conductive state that provides a path directing the ESD current to ground and away from the integrated circuit. The ESD protection device holds the power clamp device in its conductive state until the ESD current dissipates and the ESD voltage is discharged to acceptable levels.

A silicon-controlled rectifier (SCR) is a multiple-layer solid state device frequently utilized as a power clamp device in ESD protection circuits. In its high-impedance state, the silicon-controlled rectifier restricts current conduction to leakage current. However, a triggering signal can switch the silicon-controlled rectifier to a low-impedance state such that current is conducted between its anode and cathode. After the triggering signal is removed, the SCR remains in its low impedance state so long as the conducted current from the ESD event exceeds a holding current. When the conducted current drops below the holding current, the SCR returns to its high-impedance state.

Improved silicon-controlled rectifiers, electrostatic discharge circuits, and methods of fabricating a silicon-controlled rectifier for use in an electrostatic discharge circuit are needed.

SUMMARY

According to an embodiment, a device structure for a silicon controlled rectifier includes a first well of a first conductivity type in a semiconductor layer, a second well of a second conductivity type in the semiconductor layer, a cathode coupled with the first well, and an anode coupled with the second well. First and second body contacts are coupled with the first well, and the first and second body contacts each have the first conductivity type.

According to an embodiment, an electrostatic discharge protection circuit includes a silicon controlled rectifier having a first well of a first conductivity type in a semiconductor layer, a second well of a second conductivity type in the semiconductor layer, a cathode coupled with the first well, an anode coupled with the second well, a first body contact coupled with the first well, and a second body contact coupled with the first well. The first and second body contacts each have the first conductivity type. A triggering device is coupled with the first body contact.

According to an embodiment, a method of forming a device structure for a silicon controlled rectifier includes forming a first well of a first conductivity type in a semiconductor layer, forming a second well of a second conductivity type in the semiconductor layer, forming a cathode coupled with the first well, forming an anode coupled with the second well, and forming a first body contact coupled with the first well. The method further includes forming a second body contact coupled with the first well. The first and second body contacts each have the first conductivity type.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
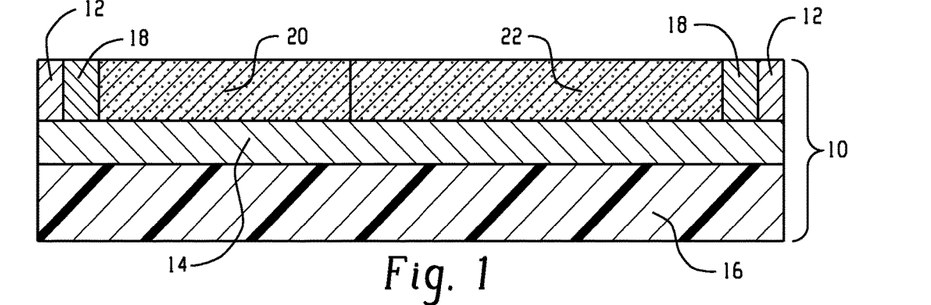
FIGS. 1-3 are cross-sectional views of a device structure at successive fabrication stages of a processing method in accordance with embodiments of the invention.

With reference to FIG. 1 and in accordance with embodiments of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 14 and is considerably thinner than the handle wafer 16. The device layer 12 is located on a top surface of the buried insulator layer 14 and is electrically insulated from the handle wafer 16 by the buried insulator layer 14. The buried insulator layer 14 may be comprised of an electrical insulator and, in particular, may constitute a buried oxide layer comprised of silicon dioxide (e.g., $SiO_2$). A device structure for a silicon-controlled rectifier is formed using the SOI substrate 10 by front-end-of-line (FEOL) processing, as described hereinbelow.

A trench isolation region 18 is formed in the device layer 12 and defines the size, geometrical shape, and outer boundary for a device region of the semiconductor material of device layer 12 in which the device structure for a silicon-controlled rectifier is formed. The trench isolation region 18 may be formed by a shallow trench isolation (STI) technique that relies on lithography and dry etching processes to define trenches that reach in depth to the top surface of the buried insulator layer 14, deposits an electrical insulator to fill the trenches, and planarizes the electrical insulator relative to the top surface of the device layer 12 using, for example, chemical mechanical polishing (CMP). The trench isolation region 18 may be comprised of a dielectric material, such as an oxide of silicon (e.g., $SiO_2$) deposited by CVD.

Juxtaposed wells 20, 22 are formed in the device layer 12 within the device region established by the trench isolation region 18. Well 22 can be formed in the device region either before or after well 20 is formed in the device region. The wells 20, 22 are comprised of lightly-doped semiconductor material of opposite conductivity types, and are located adjacent to each other in the device layer 12.

Well 20 may be formed by introducing a dopant by, for example, ion implantation at a selected location in the device region of the device layer 12. Well 22 may be formed by introducing a different dopant by, for example, ion implantation at a different selected location in the device region of the device layer 12. Respective patterned implantation masks may be used to define the selected locations for the wells 20, 22, and are stripped after each of the wells 20, 22 is formed. The semiconductor material of well 20 may comprise an n-type dopant from Group V of the Periodic Table (e.g., phosphorus (P) or arsenic (As)) effective to impart n-type conductivity. The semiconductor material of well 22 may comprise a p-type dopant selected from Group III of the Periodic Table (e.g., boron) effective to impart p-type conductivity. Implantation conditions (e.g., kinetic energy and dose) are selected to form each of the wells 20, 22 with a desired doping profile and concentration. In an embodiment, the wells 20, 22 may be constituted by lightly-doped semiconductor material formed through a selection of the implantation conditions.

Figure 2:
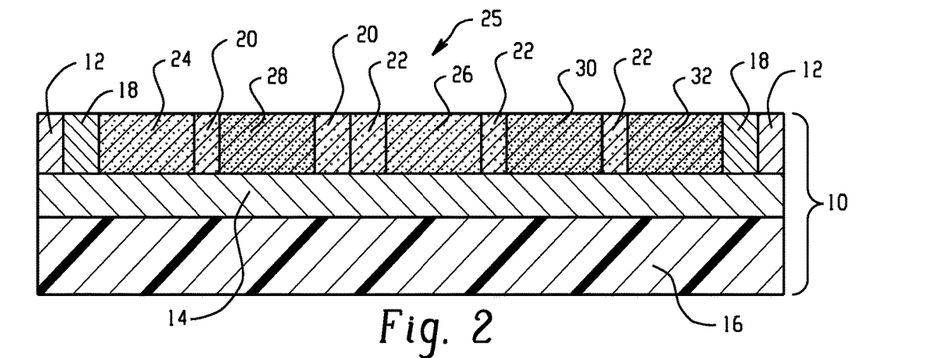

With reference to FIG. 2 in which like reference numerals refer to like features in FIG. 1 and at a subsequent fabrication stage, contacts 24, 26, 28, 30, 32 are formed as doped regions in the wells 20, 22 within the device region of the device layer 12. Contacts 24, 26 can be formed in the device region either before or after contacts 28, 30, 32 are formed in the device region.

Contact 24 is a doped region located in well 20 and contact 26 is a doped region located in well 22. Contacts 24, 26 have the same conductivity type. Contact 24 is comprised of a heavily-doped semiconductor material having the same conductivity type as the lightly-doped well 20. Contact 26 is comprised of a doped region of heavily-doped semiconductor material having the opposite conductivity type from the lightly-doped well 22. Contacts 24, 26 may be formed by introducing a dopant by, for example, ion implantation at selected locations in the device region of the device layer 12. A patterned implantation mask may be used to define the selected locations for the contacts 24, 26 and is stripped after implantation. In an embodiment in which the well 20 is n-type semiconductor material and the well 22 is p-type semiconductor material, the semiconductor material constituting the contacts 24, 26 may comprise an n-type dopant effective to impart n-type conductivity. Implantation conditions are selected to form each of the contacts 24, 26 with a desired doping profile and concentration.

Contact 28 is a doped region that is located in well 20 and contacts 30, 32 are doped regions that are located at different locations in well 22. Contact 28 is comprised of heavily-doped semiconductor material having the opposite conductivity type from the lightly-doped well 20 and contacts 30, 32 are comprised of heavily-doped semiconductor material having the same conductivity type as the lightly-doped well 22. Contacts 28, 30, 32 may be formed by introducing a dopant by, for example, ion implantation at selected locations in the device region of the device layer 12. A patterned implantation mask may be used to define the selected locations for the contacts 28, 30, 32 and is stripped after implantation. In an embodiment in which the well 20 is n-type semiconductor material and the well 22 is p-type semiconductor material, the semiconductor material of contacts 28, 30, 32 may comprise a p-type dopant effective to impart p-type conductivity. Implantation conditions are selected to form each of the contacts 28, 30, 32 with a desired doping profile and concentration.

As used herein, heavily doped semiconductor material may be considered to have a dopant concentration that is at least an order of magnitude higher than the dopant concentration in lightly doped semiconductor material. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

The resultant device structure is a silicon controlled rectifier (SCR) 25 that includes an additional contact 30. Contact 28 functions as an anode of the SCR 25, contact 26 functions as a cathode of the SCR 25, contact 24 functions as a body contact to the well 20, and contact 32 functions as a body contact to the well 22. The SCR 25 includes p-n junctions 34, 36, 38 across each of which the conductivity type of the semiconductor material changes from n-type to p-type. Contact 28 is butted with well 20 to define the p-n junction 34, well 20 is butted with well 22 to define the p-n junction 36, and contact 26 is butted with well 22 to define the p-n junction 38.

Contact 30 operates as another body contact in addition to contact 32 but is not coupled with the anode. Contact 30 represents a triggering region for the SCR 25 that is coupled through the well 22 with the contact 26, which is likewise located in well 22 and functions as the cathode of the SCR 25, and is coupled through the well 22 with the contact 32, which is likewise located in well 22 and functions as a body contact of the SCR 25. The contact 30 is physically located in the well 22 horizontally between the contact 26 and the contact 32. A section of the well 22 is located between the outer boundary of the contact 30 and the contact 26 serving as the cathode. Another section of the well 22 is located between the outer boundary of the contact 30 and the contact 32 serving as a body contact. These sections of the well 22 represent electrical resistances that can be resolved into vertical and horizontal components, as discussed hereinbelow.

In an alternative embodiment, the fabrication process may be performed using a bulk substrate, such as a bulk silicon wafer, instead of the SOI substrate 10. In this instance, the wells 20, 22 of the opposite conductivity types are formed in the semiconductor material of the bulk substrate and define tubs of doped semiconductor material in which the contacts 24, 26 and contacts 28, 30, 32 are formed. Trench isolation regions, similar to trench isolation region 18, are formed in the bulk substrate and electrically isolate adjacent pairs of the contacts 24, 26, 28, 30, 32 from each other.

Figure 3:
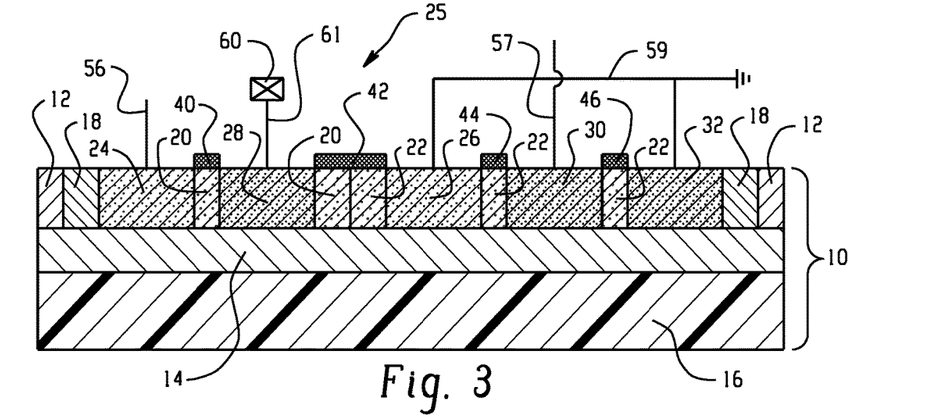
Figure 4:
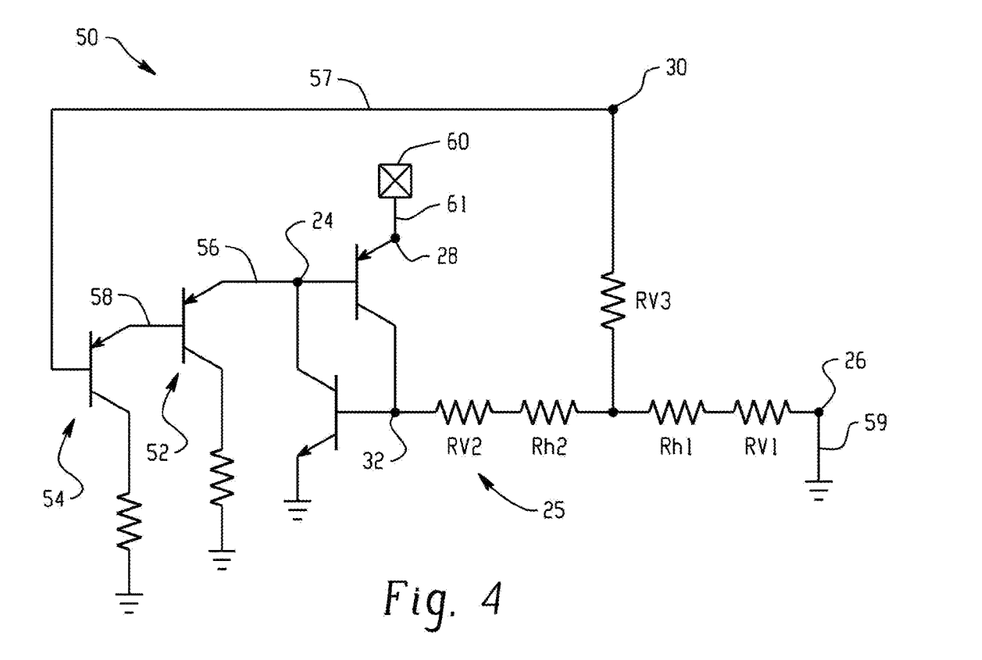
FIG. 4 is a circuit diagram that includes the device structure of FIG. 3.

With reference to FIGS. 3 and 4 in which like reference numerals refer to like features in FIG. 2 and at a subsequent fabrication stage, features 40, 42, 44, 46 are formed on the top surface of device layer 12 in the device region. Feature 40 primarily covers a portion of well 20 laterally between contacts 24 and 28. Feature 42 primarily covers the abutting portions of well 20 and well 22 laterally between contacts 26 and 28. Feature 44 primarily covers a portion of well 22 laterally between contacts 26 and 30. Feature 46 primarily covers a portion of well 22 laterally between contacts 30 and 32. A silicide layer (not shown) may be formed on surface areas of the top surface of the device layer 12 not covered by features 40, 42, 44, 46. The features 40, 42, 44, 46 may be comprised of a dielectric material that is an electrical insulator, such as silicon dioxide ($SiO_2$) or silicon nitride ($Si_3N_4$), that is deposited by, for example, CVD and patterned.

Middle-of-line (MOL) and back-end-of-line (BEOL) processing follows, which includes formation of vertical interconnection contacts and wiring for the local interconnect level overlying the SCR 25, and formation of dielectric layers, metal-filled vias, and metal wiring for the BEOL interconnect levels coupled by the local interconnect wiring with the SCR 25. The network of vertical interconnection contacts, metal-filled vias, and metal wiring defines wiring paths.

The SCR 25 may be an element of an ESD protection circuit 50 for a chip that further includes a string of diodes 52, 54 used to trigger the SCR 25 under conditions of an ESD pulse. A wiring path 56 connects the contact 24 of the SCR 25 with a terminal of diode 52 and a wiring path 57 connects a terminal of diode 54 with the contact 30 of the SCR 25. The other terminals of the diodes 52, 54 are connected by a wiring path 58 so that the diodes 52, 54 are connected in series. A wiring path 59 connects the contact 26, which functions as the cathode of the SCR 25, and contact 32, which functions as a body contact of the SCR 25, with ground. The contact 28, which functions as the anode of the SCR 25, is connected by a wiring path 61 with an input/output (I/O) pad 60, which may also be coupled with a core integrated circuit of the chip. The I/O pad 60, which is susceptible to the occurrence of an ESD event, is a small conductive area in the topmost level of the interconnect structure on the chip at which an external conductor (e.g., a wire or a ball bond) can be coupled with the chip. Signals may be communicated from an external environment of the chip to a core integrated circuit of the chip and from the core integrated circuit to the external environment at the input/output pad 14. The core integrated circuit of the chip may be comprised of devices formed by front-end-of-line (FEOL) processing and may include various specific circuits and devices, such as field-effect transistors fabricated by complementary-metal-oxide-semiconductor (CMOS) processes.

Contact 30 introduces an additional resistance into the protection circuit 50, as diagrammatically indicated in FIG. 4. In particular, a vertical resistance component RV3 due to the presence of contact 30 is introduced that is additive to a vertical resistance component RV1, a vertical resistance component RV2, a horizontal resistance component Rh1, and a horizontal resistance component Rh2 between contact 26 and contact 32. These resistance components are provided by sections of the lightly-doped semiconductor material of the well 22. The contact 30 provides an additional current path coupling the diodes 52, 54 with the contact 32 and the well 22. During an ESD event, the additional current introduced at contact 30 raises the potential of the well 22 and aids in triggering the SCR 25.

Figure 5:
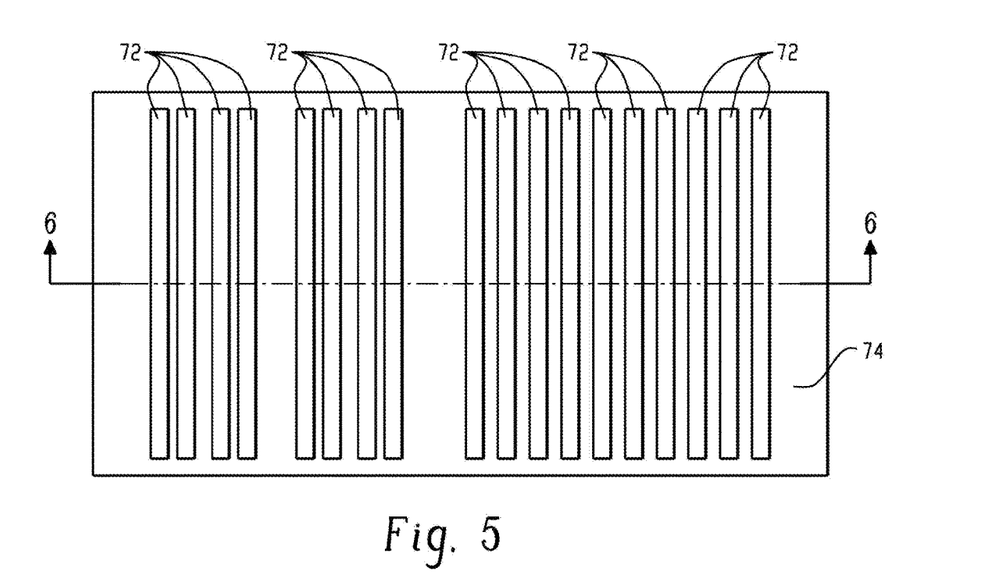
FIG. 5 is a top view of a device structure at an initial fabrication stage of a processing method in accordance with embodiments of the invention.
Figure 6:
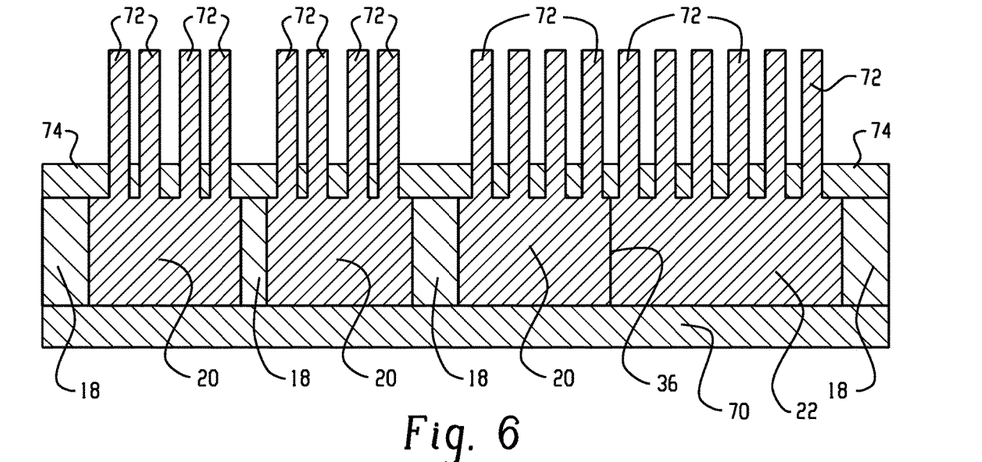
FIG. 6 is a cross-sectional view taken generally along line 6-6 in FIG. 5.

With reference to FIGS. 5 and 6 in which like reference numerals refer to like features in FIGS. 1-4 and in accordance with alternative embodiments, an SCR 125 and diodes 52, 54 (FIG. 7) for use in the ESD protection circuit 50 as replacements for SCR 25 and diodes 52, 54 may be fabricated by front-end-of-line (FEOL) processing using fins as contacts, rather than doped regions in a substrate.

The wells 20, 22, which are comprised of lightly-doped semiconductor material of opposite conductivity types, may be formed in a semiconductor substrate 70 by respective masked implantations as described above in the context of FIG. 1. The well 20 is sectioned by trench isolation regions 18 that are formed in the substrate 70. One of the sections of the well 20 abuts the well 22 along the p-n junction 36. The semiconductor material of well 20 may comprise an n-type dopant from Group V of the Periodic Table (e.g., phosphorus (P) or arsenic (As)) effective to impart n-type conductivity. The semiconductor material of well 22 may comprise a p-type dopant selected from Group III of the Periodic Table (e.g., boron) effective to impart p-type conductivity. In a representative embodiment, the substrate 70 may be a bulk substrate.

Fins 72 may be formed from the lightly-doped semiconductor material of the wells 20, 22 by photolithography and etching processes using, for example, a sidewall image transfer process. To that end, a hardmask layer and a sacrificial layer comprised of, for example, polysilicon may be deposited in a stack on the top surface of the substrate 70 and the sacrificial layer patterned to define mandrels in the regions of the substrate 70 used to form the fins 72. Spacers are then formed on the sidewalls of the mandrels. The mandrels are arranged such that the spacers are formed at the intended locations for the fins 72. The mandrels are then removed selective to the spacers using an etching process, such as RIE. The hardmask layer and the substrate 70 are patterned with an etching process, such as RIE, using one or more etching chemistries and in which the spacers operate as etch masks for forming the fins 72. The spacers and hardmask layer may be removed subsequent to the etching process.

The fins 72 are three-dimensional, non-planar bodies of semiconductor material that project upwardly from the top surface of the substrate 70, and have a parallel arrangement along their lengths. Fins 72 formed from the lightly-doped semiconductor material of well 20 will adopt the conductivity type of the well 20. Fins 72 formed from the lightly-doped semiconductor material of well 22 will adopt the conductivity type of the well 22.

An insulating layer 74 surrounds respective lower portions of the fins 72. After the fins 72 are formed, the insulating layer 74 may be formed by depositing a dielectric material using a suitable deposition technique, such as silicon dioxide ($SiO_2$) deposited by CVD, and then an etch-back process to reduce the deposited thickness.

Figure 7:
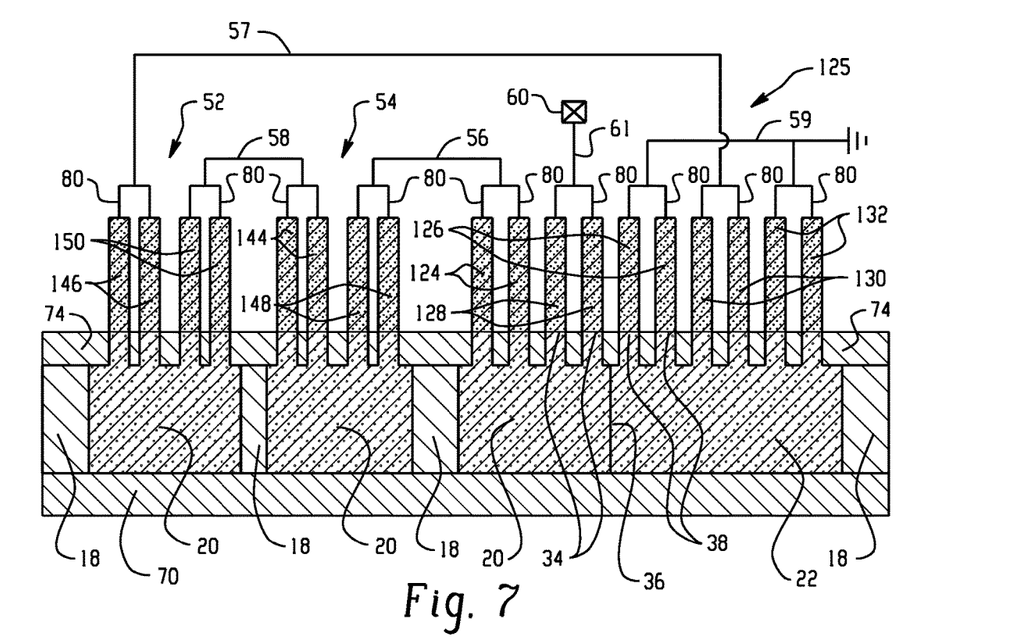
FIG. 7 is a cross-sectional view similar to FIG. 6 at a subsequent fabrication stage.

With reference to FIG. 7 in which like reference numerals refer to like features in FIG. 6 and at a subsequent fabrication stage, a contact 124 is formed in some of the fins 72 (FIG. 6) projecting upward from the section of well 20 that abuts well 22 to form the vertical junction 36. A contact 126 is formed in some of the fins 72 projecting upward from well 22. The contacts 124, 126 have the same conductivity type. Contact 124 is comprised of heavily-doped semiconductor material having the same conductivity type as the lightly-doped well 20 and contact 126 is comprised of heavily-doped semiconductor material having the opposite conductivity type from the lightly-doped well 22.

Contacts 144, 146 are formed in some of the fins 72 projecting upward from sections of well 20 that are used to form the diodes 52, 54. The contacts 144, 146 are comprised of heavily-doped semiconductor material having the same conductivity type as the lightly-doped well 20, and may be concurrently formed along with the contacts 124, 126.

In the representative embodiment, each of the contacts 124, 126, 144, 146 is formed in multiple fins and, in alternative embodiments, may each be formed in three or more fins 72 or in only a single fin 72. In the representative embodiment, the contacts 124, 126, 144, 146 are located in a portion of the respective fins 72 that is located above the portion of the fin height that is covered by the insulating layer 74. However, the portion of the fin height containing the contacts 124, 126, 144, 146 may differ from the representative embodiment through, for example, an adjustment made to the implantation conditions. Similar to the formation of contacts 24, 26 (FIG. 1), contacts 124, 126, 144, 146 may be formed by implanting ions of a dopant into selected fins 72 in the presence of a patterned mask (not shown) to supply an electrically-active dopant. Implantation conditions are selected to form each of the contacts 124, 126, 134, 136 with a desired doping profile and concentration (e.g., heavy doping). After the ion implantation is completed, the patterned mask is stripped.

Contact 128 is formed in some of the fins 72 projecting upward from the section of well 20 that abuts well 22 to form the vertical junction 36 and contacts 130, 132 are formed in some of the fins 72 projecting upward from well 22. Contact 128 is comprised of heavily-doped semiconductor material having the opposite conductivity type from the lightly-doped well 20 and contacts 130, 132 are comprised of heavily-doped semiconductor material having the same conductivity type as the lightly-doped well 22.

Contacts 148, 150 are also formed in some of the fins 72 projecting upward from sections of well 20 that are used to form the diodes 52, 54. The contacts 148, 150 are comprised of heavily-doped semiconductor material having the opposite conductivity type from the lightly-doped well 20, and may be concurrently formed along with the contacts 128, 130, 132.

In the representative embodiment, each of the contacts 128, 130, 132, 148, 150 is formed in multiple fins and, in alternative embodiments, may each be formed in three or more fins 72 or in only a single fin 72. In the representative embodiment, the contacts 128, 130, 132, 148, 150 are located in a portion of the respective fins 72 that is located above the portion of the fin height that is covered by the insulating layer 74. However, the portion of the fin height containing the contacts 128, 130, 132, 148, 150 may differ from the representative embodiment through, for example, an adjustment made to the implantation conditions. Similar to the formation of contacts 28, 30, 32 (FIG. 1), contacts 128, 130, 132, 148, 150 may be formed by implanting ions of a dopant into selected fins 72 in the presence of a patterned mask (not shown) to supply an electrically-active dopant. Implantation conditions are selected to form each of the contacts 128, 130, 132, 148, 150 with a desired doping profile and concentration (e.g., heavy doping). After the ion implantation is completed, the patterned mask is stripped.

The resultant device structure includes a silicon controlled rectifier (SCR) 125 that, similar to SCR 25, has an additional contact 130. Contact 128 functions as an anode of the SCR 125, contact 126 functions as a cathode of the SCR 125, contact 124 functions as a body contact to the well 18, and contact 132 functions as a body contact to the well 20. The SCR 125 includes the p-n junctions 34, 36, 38 across each of which the conductivity type of the semiconductor material changes. Contact 128 is butted with well 20 to define the p-n junction 34, well 20 is butted with well 22 to define the p-n junction 36, and well 22 is butted with contact 126 to define the p-n junction 38.

Contact 130 introduces an additional doped region of the SCR 125 that is formed in the fins 72 projecting upward from the well 22. Contact 130 represents a triggering region for the SCR 125 that is coupled through the well 22 with the contact 126, which is also formed in fins 72 projecting upward from the well 22 and functions as the cathode of the SCR 125. The fins 72 constituting the contact 130 are physically located laterally between the fins 72 constituting the contact 126 functioning as the cathode of the SCR 125 and the fins 72 constituting the contact 132 functioning as a connection to the well 22 in the body of the SCR 125.

Each of the diodes 52, 54 is a two-terminal electronic component characterized by an asymmetric conductance. The contacts 148, 150 function as a terminal of the respective diodes 52, 54, and the contacts 144, 146 and well 20 function as the other terminal of the respective diodes 52, 54. The semiconductor material constituting the contacts 148, 150 has an opposite conductivity type from the semiconductor material constituting the contacts 144, 146 and well 20. The terminals of each of the diodes 52, 54 meet along a p-n junction at, in the representative embodiment, the juncture of the contacts 148, 150 and the respective portion of the well 20. Each of the diodes 52, 54 has a low resistance (i.e., a high conductance) to current when biased in a forward direction and a high resistance (i.e., a low conductance) to current when biased in an opposite direction.

The fins 72 constituting of each of the contacts 124, 126, 128, 130, 132, 144, 146, 148, 150 are connected together by connections 80. These connections 80 may be comprised vertical interconnection contacts formed in the local interconnect level. In addition, these connections 80 may further include semiconductor material that is, for example, epitaxially grown from the sidewalls of the fins 72 in order to merge the fins 72 of each of the contacts 124, 126, 128, 130, 132, 144, 146, 148, 150 and provide a larger area for landing the vertical interconnection contacts.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a silicon controlled rectifier, the device structure comprising:

a first well of a first conductivity type in a semiconductor layer;
a second well of a second conductivity type in the semiconductor layer;
a cathode coupled with the first well;
an anode coupled with the second well;
a first body contact coupled with the first well, the first body contact having the first conductivity type; and
a second body contact coupled with the first well, the second body contact having the first conductivity type,
wherein the first well includes a first section that is arranged between the cathode and the first body contact, the first well includes a second section that is arranged between the first body contact and the second body contact, and the cathode is arranged between the first body contact and the anode.

2. The device structure of claim 1 wherein the first body contact comprises a first doped region of the first conductivity type in the first well, the second body contact comprises a second doped region of the first conductivity type in the first well, and the first doped region and the second doped region each have a dopant concentration that is greater than a dopant concentration of the first well.

3. The device structure of claim 2 wherein the cathode comprises a third doped region of the second conductivity type in the first well, and the anode comprises a doped region of the first conductivity type in the second well.

4. A device structure for a silicon controlled rectifier, the device structure comprising:
a first well of a first conductivity type in a semiconductor layer;
a second well of a second conductivity type in the semiconductor layer;
a cathode coupled with the first well;
an anode coupled with the second well;
a first semiconductor fin that projects upward from the first well;
a second semiconductor fin that projects upward from the first well;
an insulating layer arranged to surround respective lower portions of the first semiconductor fin and the second semiconductor fin;
a first body contact arranged in an upper portion of the first semiconductor fin above the insulating layer, the first body contact having the first conductivity type and a first dopant concentration that is greater than a dopant concentration of the first well; and
a second body contact arranged in an upper portion of the second semiconductor fin above the insulating layer, the second body contact having the first conductivity type and a second dopant concentration that is greater than a dopant concentration of the first well.

5. The device structure of claim 4 wherein the first semiconductor fin is separated from the second semiconductor fin by a section of the first well.

6. The device structure of claim 4 wherein the first semiconductor fin has a lengthwise parallel alignment with the first semiconductor fin.

7. The device structure of claim 4 wherein the cathode comprises a third semiconductor fin projecting from the first well, the anode comprises a fourth semiconductor fin projecting from the second well, the third semiconductor fin is comprised of semiconductor material having the second conductivity type, and the fourth semiconductor fin is comprised of semiconductor material having the first conductivity type.

8. The device structure of claim 4 wherein the first body contact is further arranged in a portion of a third semiconductor fin projecting from the first well, and the second body contact is further arranged in a portion of a fourth semiconductor fin projecting from the first well.

9. An electrostatic discharge protection circuit comprising:
a silicon controlled rectifier including a first well of a first conductivity type in a semiconductor layer, a second well of a second conductivity type in the semiconductor layer, a cathode coupled with the first well, an anode coupled with the second well, a first body contact coupled with the first well, and a second body contact coupled with the first well, the first body contact and the second body contact each having the first conductivity type; and
a triggering device coupled with the first body contact,
wherein the first well includes a first section that is arranged between the cathode and the first body contact, the first well includes a second section that is arranged between the first body contact and the second body contact, and the cathode is arranged between the first body contact and the anode.

10. An electrostatic discharge protection circuit comprising:
a silicon controlled rectifier including a first well of a first conductivity type in a semiconductor layer, a second well of a second conductivity type in the semiconductor layer, a cathode coupled with the first well, an anode coupled with the second well, a first body contact coupled with the first well, and a second body contact coupled with the first well, the first body contact and the second body contact each having the first conductivity type; and
a triggering device coupled with the first body contact,
wherein the first body contact comprises a first semiconductor fin projecting from the first well, the second body contact comprises a second semiconductor fin projecting from the first well, and the first semiconductor fin and the second semiconductor fin each contain a dopant concentration that is greater than a dopant concentration of the first well; and
wherein the triggering device is a diode that includes a third well of the first conductivity type in the semiconductor layer, a third semiconductor fin projecting from the third well, a fourth semiconductor fin projecting from the third well, the third semiconductor fin is comprised of semiconductor material having the first conductivity type, and the fourth semiconductor fin is comprised of semiconductor material having the second conductivity type.

11. The electrostatic discharge protection circuit of claim 10 wherein the first semiconductor fin is separated from the second semiconductor fin by a section of the first well.

12. The electrostatic discharge protection circuit of claim 11 wherein the cathode comprises a fifth semiconductor fin projecting from the first well, the anode comprises a sixth semiconductor fin projecting from the second well, the fifth semiconductor fin is comprised of semiconductor material having the second conductivity type, and the sixth semiconductor fin is comprised of semiconductor material having the first conductivity type.

13. The electrostatic discharge protection circuit of claim 11 wherein the first body contact comprises a fifth semiconductor fin projecting from the first well, the second body contact comprises a sixth semiconductor fin projecting from the first well, and the fifth semiconductor fin and the sixth semiconductor fin each have the dopant concentration that is greater than the dopant concentration of the first well.

14. The electrostatic discharge protection circuit of claim 9 wherein the first body contact comprises a first doped region of the first conductivity type in the first well, the second body contact comprises a second doped region of the first conductivity type in the first well, and the first doped region and the second doped region each have a dopant concentration that is greater than a dopant concentration of the first well.

15. The electrostatic discharge protection circuit of claim 14 wherein the cathode comprises a third doped region of the second conductivity type in the first well, and the anode comprises a doped region of the first conductivity type in the second well.

* * * * *

UNITED STATES PATENT AND TRADEMARK OFFICE
CERTIFICATE OF CORRECTION

PATENT NO. : 10,347,622 B2
APPLICATION NO. : 15/398946
DATED : July 9, 2019
INVENTOR(S) : You Li Page 1 of 1

It is certified that error appears in the above-identified patent and that said Letters Patent is hereby corrected as shown below:

In the Claims

Column 10, Claim 10, Line 44, change "first" to --second--

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*